(12) United States Patent
Bhushan et al.

(10) Patent No.: US 7,085,658 B2
(45) Date of Patent: Aug. 1, 2006

(54) METHOD AND APPARATUS FOR RAPID INLINE MEASUREMENT OF PARAMETER SPREADS AND DEFECTS IN INTEGRATED CIRCUIT CHIPS

(75) Inventors: Manjul Bhushan, Hopewell Junction, NY (US); Mark B. Ketchen, Hadley, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/969,764

(22) Filed: Oct. 20, 2004

(65) Prior Publication Data

US 2006/0100811 A1     May 11, 2006

(51) Int. Cl.
*G06F 19/00* (2006.01)
(52) U.S. Cl. .......................................... 702/57; 438/16
(58) Field of Classification Search .................. 702/57; 438/16
See application file for complete search history.

(56) References Cited

U.S. PATENT DOCUMENTS

| | | | | |
|---|---|---|---|---|
| 3,900,837 A | * | 8/1975 | Hunter | 365/200 |
| 5,276,648 A | * | 1/1994 | Yanagisawa et al. | 365/201 |
| 2002/0191469 A1 | * | 12/2002 | Honma et al. | 365/226 |
| 2004/0053429 A1 | * | 3/2004 | Muranaka | 438/17 |

* cited by examiner

*Primary Examiner*—Edward Raymond
(74) *Attorney, Agent, or Firm*—Wan Yee Cheung

(57) ABSTRACT

A method and apparatus for monitoring a plurality of semiconductor devices is disclosed. At least one array of $2^n$ semiconductor circuits is provided. A clock ring oscillator provides a clock signal. The clock signal drives a frequency divider followed by an n-stage binary counter. The outputs from the counter's stages drive an n-input decoder which sequentially addresses each semiconductor circuit. An output signal from each semiconductor circuit is measured and read out over a common bus, where a distribution of the output signals is a measure of a distribution of a parameter of interest.

74 Claims, 12 Drawing Sheets

US 7,085,658 B2

METHOD AND APPARATUS FOR RAPID INLINE MEASUREMENT OF PARAMETER SPREADS AND DEFECTS IN INTEGRATED CIRCUIT CHIPS

BACKGROUND OF THE INVENTION

Circuit failures, such as Static Random Access Memory (SRAM) cell instability fails in a large memory array, arising from statistical fluctuations in Metal-Oxide Semiconductor Field-Effect Transistor (MOSFET) parameters, or hard fails, from Back End of Line (BEOL) shorts and opens, directly impact both the yield and reliability of Complementary Metal Oxide Semiconductor (CMOS) products. MOSFET characteristics of a few devices (typically ten to twenty) are measured in the manufacturing line to monitor process variations, but provide little information on statistical variations. Test time and subsequently cost limitations preclude the measurements of a large array of field effect transistors (FETs) in-line. Process yield monitors use large memory arrays however array failures do not directly provide information on the individual MOSFET (Positive-Channel Metal Oxide Semiconductor (PMOS) and Negative-Channel Metal Oxide Semiconductor (NMOS)) components. BEOL yield monitors are used to provide information on random opens and shorts, with localization possible at the cost of design complexity. Memory array yield monitors and BEOL yield monitors that provide localization require external clocks using expensive test equipment with relatively long test times.

There is a need in the art for test structures that can rapidly provide statistical information on properties of a large number of devices as well as identification of random opens and shorts, all with localization, using only direct current (DC) inputs and standard in-line test equipment.

SUMMARY OF THE INVENTION

The present invention discloses a method and apparatus for monitoring a plurality of semiconductor devices. In one embodiment of the apparatus at least one array of $2^n$ semiconductor circuits is provided. A clock ring oscillator provides a clock signal. The clock signal drives a frequency divider followed by an n-stage binary counter. The outputs from the counter's stages drive an n-input decoder which sequentially addresses each semiconductor circuit. An output signal from each semiconductor circuit is measured and read out over a common bus, where a distribution of the output signals is a measure of a distribution of a parameter of interest.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

The circuit technique described in this disclosure allows rapid measurements of MOSFET characteristics (as well as random defects such as BEOL opens and shorts) by mapping parameter spreads, e.g., the variations in threshold voltage, to the variations in the output voltage, current, or frequency of an array of nominally identical semiconductor circuits. In other words, a distribution of an output signal, e.g., voltage current, frequency, would be used to gauge or determine the distribution of a parameter of interest, e.g., threshold voltage, drain current or drain to source current, current in a linear region of a transistor (e.g., n-channel FET or p-channel FET), or resistance. In one embodiment, the semiconductor circuits in the array are ring oscillators, with a common output, that are turned on and off sequentially. The output frequency of the array circuit is modulated as individual rings characterized by different values of Vt are selected, and a commercial frequency counter is employed to measure the distribution of the frequency, e.g., the mean, as well as the physical location of each ring for future physical analysis.

Figure 1:
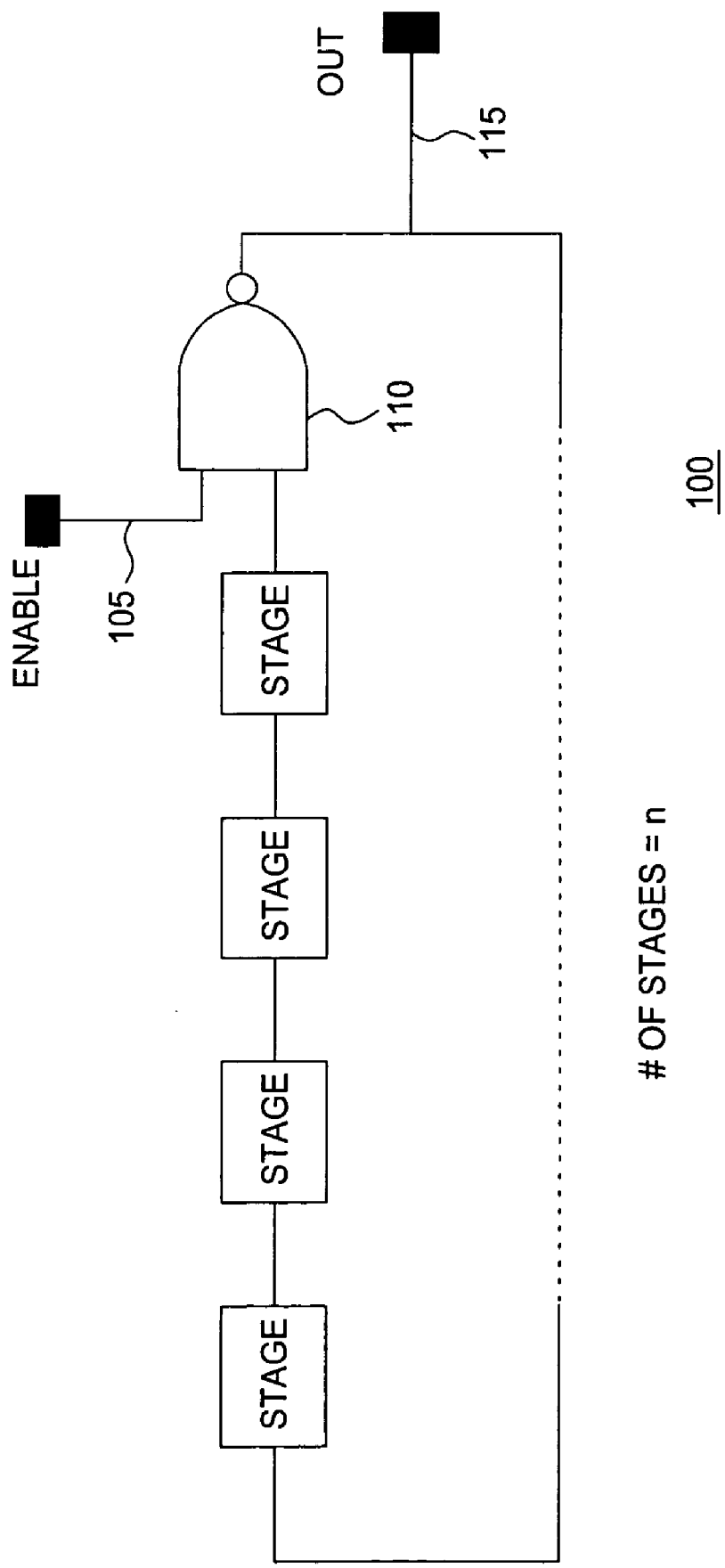
FIG. 1 illustrates a ring oscillator in accordance with one embodiment of the present invention.

One embodiment of the invention is illustrated in FIG. 1. FIG. 1 discloses a ring oscillator (RO) circuit 100 with an input 105 to enable the ring and a single output 115. In this embodiment, RO circuit 100 comprises five stages (i.e., n=5), including Not AND (NAND) gate 110.

Figure 2:
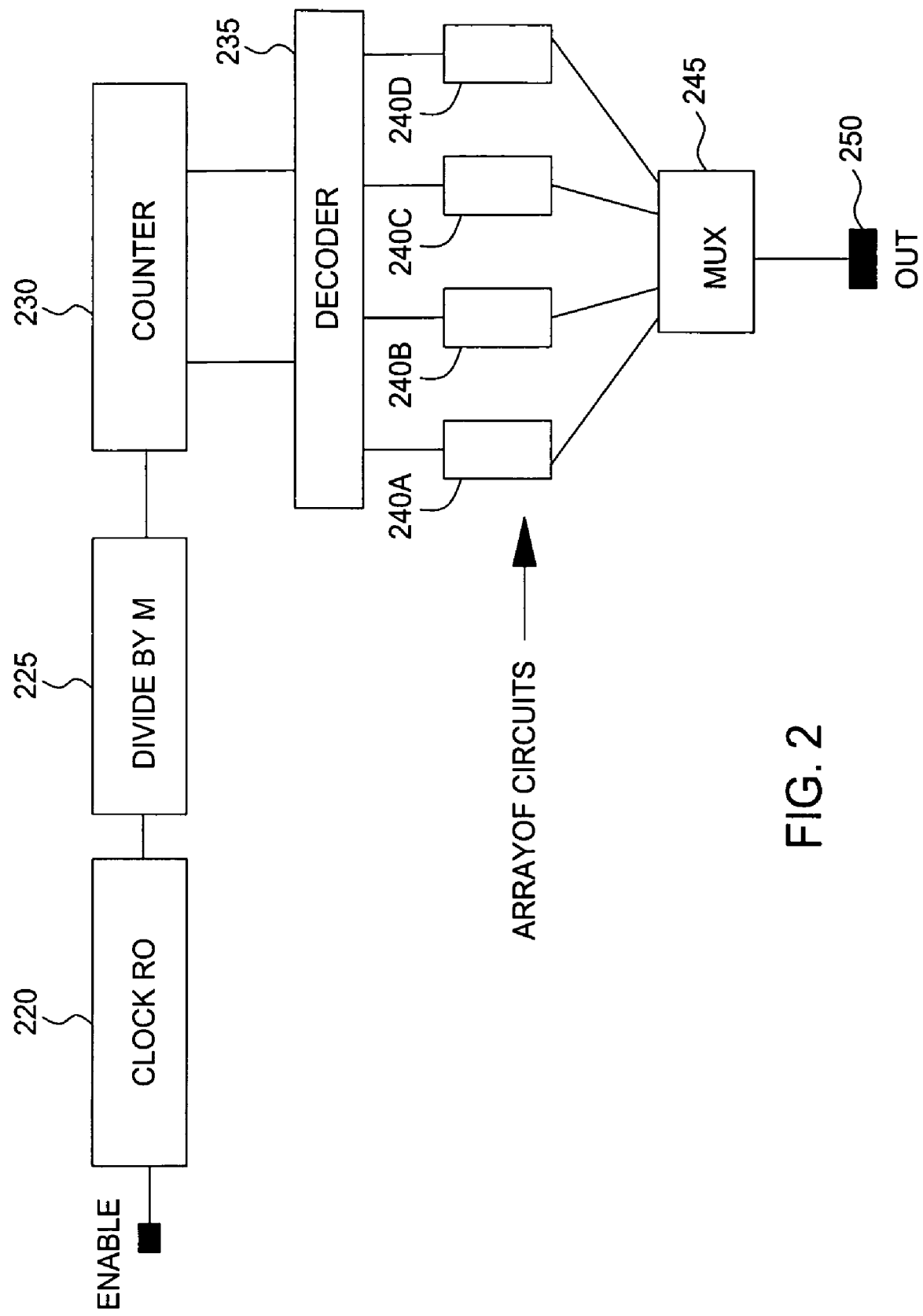
FIG. 2 illustrates a circuit for sequentially addressing and reading out an array of semiconductor circuits in accordance with one embodiment of the present invention.

FIG. 2 illustrates a circuit for sequentially addressing and reading out an array of semiconductor circuits in accordance with one embodiment of the present invention. In one embodiment, the semiconductor circuits are an array of ROs. Clock RO 220 generates a clock of period t that is slowed down by a factor M by a divider 225 and drives a counter 230 followed by a decoder 235. The decoder enables each array RO 240A–D sequentially for a fixed time interval T, where T=M t. The outputs of the array ROs 240A–D are multiplexed by a multiplexer 245 so that the OUT node 250 follows the array RO that has been enabled. It should be noted that the decoder can be a one dimensional decoder with one selecting output or a two dimensional decoder with a first selecting (X) output and a second selecting (Y) output.

Figure 3:
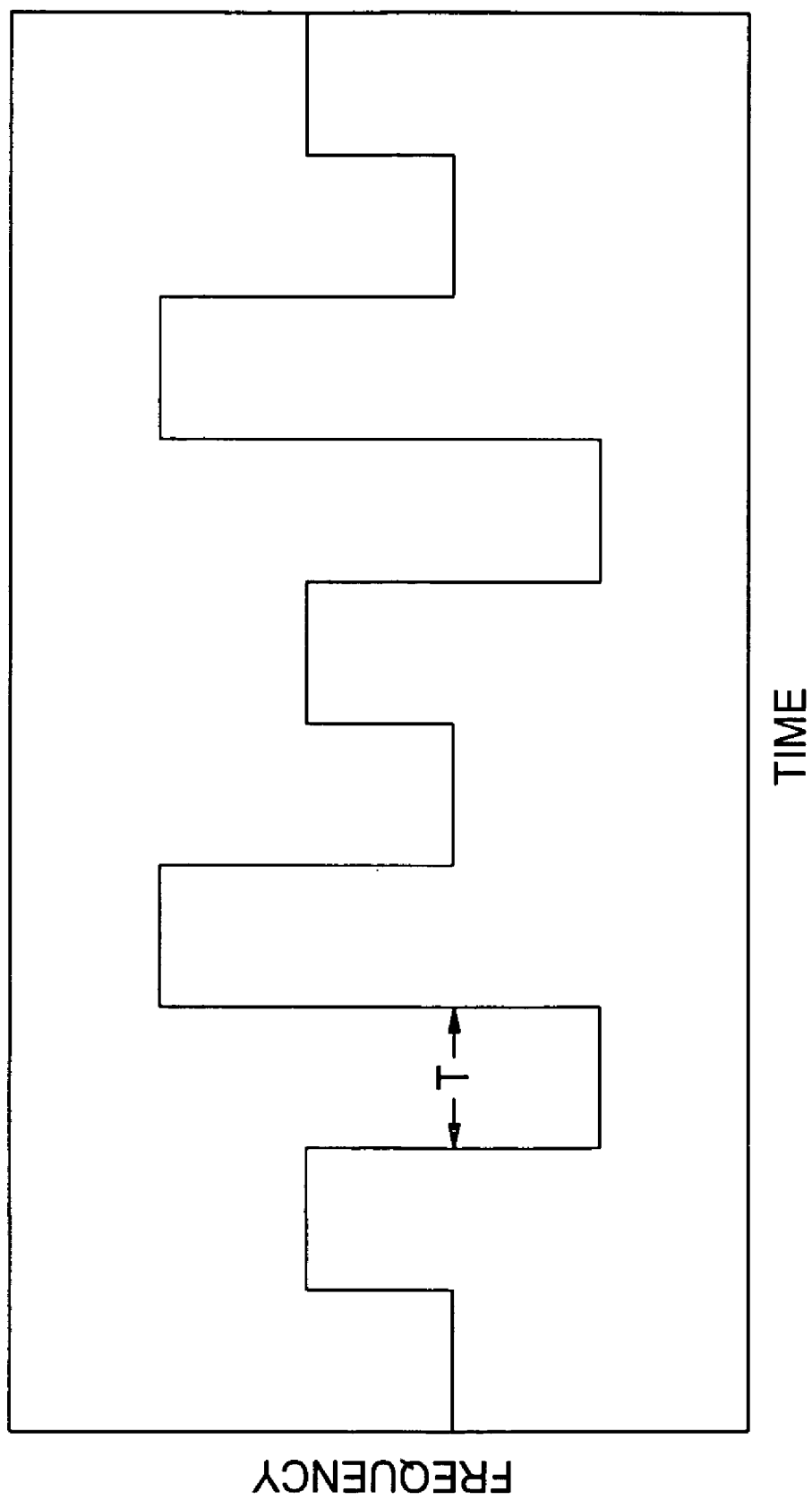
FIG. 3 illustrates an output frequency of a circuit in accordance with one embodiment of the present invention.

FIG. 3 illustrates an output frequency of a circuit in accordance with one embodiment of the present invention. FIG. 3 shows that the frequency is constant for time intervals of length T, each frequency corresponding to a single array RO. Since all array ROs are identical by design, the frequency difference is caused by variations in the device parameters of the gates within one array RO compared to others. It is possible to configure the ring oscillators such that the variation in stage delay is dominated by the variation of a single parameter, for example the Vt of a very small passgate. By designing the ring with a small number of stages (e.g. n=5) the statistical variation in ring frequency is then reduced only by a factor of $n^{1/2}$ of what the statistical variation would be if it were determined by a single stage.

Figure 4:
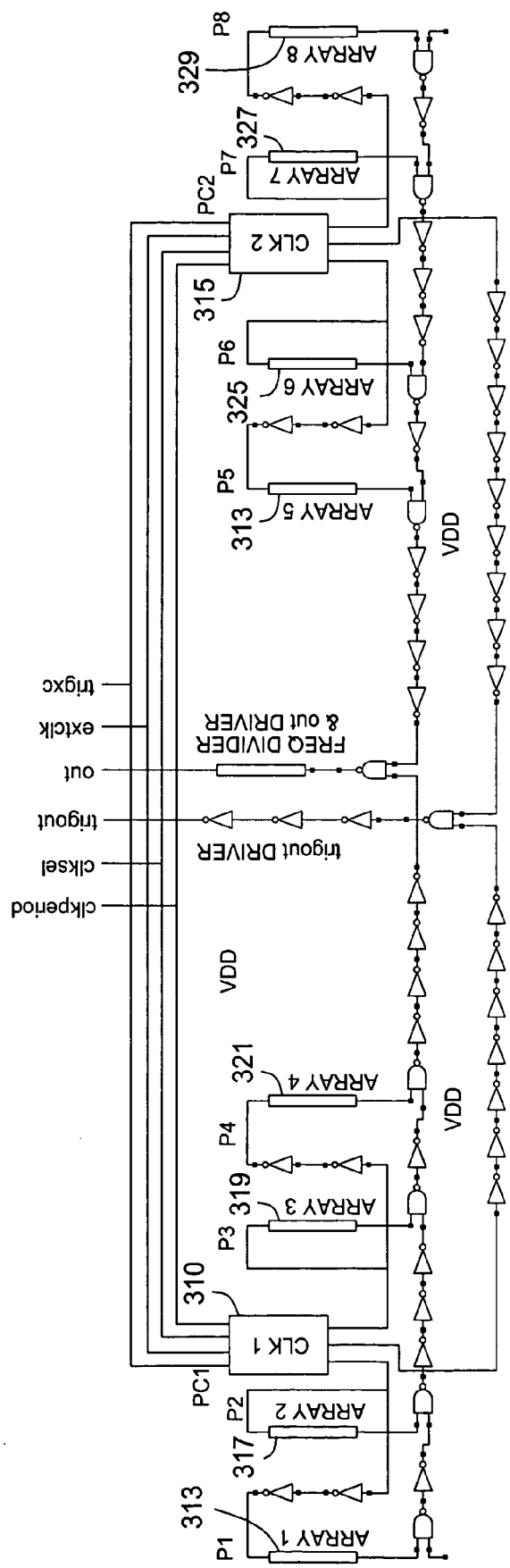
FIG. 4 illustrates a top level circuit schematic in accordance with one embodiment of the present invention.

FIG. 4 shows the top level schematic of one embodiment of the present invention, designed in 90 nm silicon-on-insulator (SOI) technology. In this embodiment there are two independent clock circuits 310, 315. Clock 310 services four array macros 313, 317, 319, 321. Clock 315 also services four array macros, 323, 325, 327, 329. Array macros 313, 317, 319, 321, 323, 325, 327, 329 individually contain 64 ring oscillators. In this embodiment there are 11 independent power supplies, P1–P8, which independently power the arrays, PC1, PC2, and VDD. PC1 and PC2 independently power the clock circuits. Although power supplies are not physically shown, one having skill in the art would be able to deduce the logical location of the power supplies from FIG. 4. VDD powers the two output drivers and all the Not ANDs (NANDs), Not Ors (NORs) and inverters explicitly shown in FIG. 4. At any given time only one clock circuit and one array are powered along with VDD. The outputs of the seven unpowered arrays are all 0's that are applied to the corresponding inputs of the VDD powered NOR2s. The output of the powered array is the frequency modulated signal described above in the array section. This signal with a F of about 1 GHz passes along the inverter/NOR chain, through the NAND2 that combines left and right sides, and through an 8 stage (divide by 256) frequency divider to render a 4 MHz signal that is sent out through an off chip driver to be measured with a standard frequency counter. The external inputs function exactly as described in the clock section above. If enabled by trigxc, the trigout signal from the selected clock circuit travels along an inverter chain, through another NAND2 that combines left and right sides, and out through a second offchip driver to be used as a trigger for the frequency counter that is measuring the array output frequency. In such a triggered configuration the individual array ring oscillator frequencies are then synchronously measured, with spatial correlation directly available. For example, one ring can be eliminated so that a marker in the form of a time increment with a zero level, e.g., 0 output frequency will be present. The counter can also be run asynchronously at a higher repetition rate to obtain the distribution of frequencies with no spatial correlation.

Figure 5:
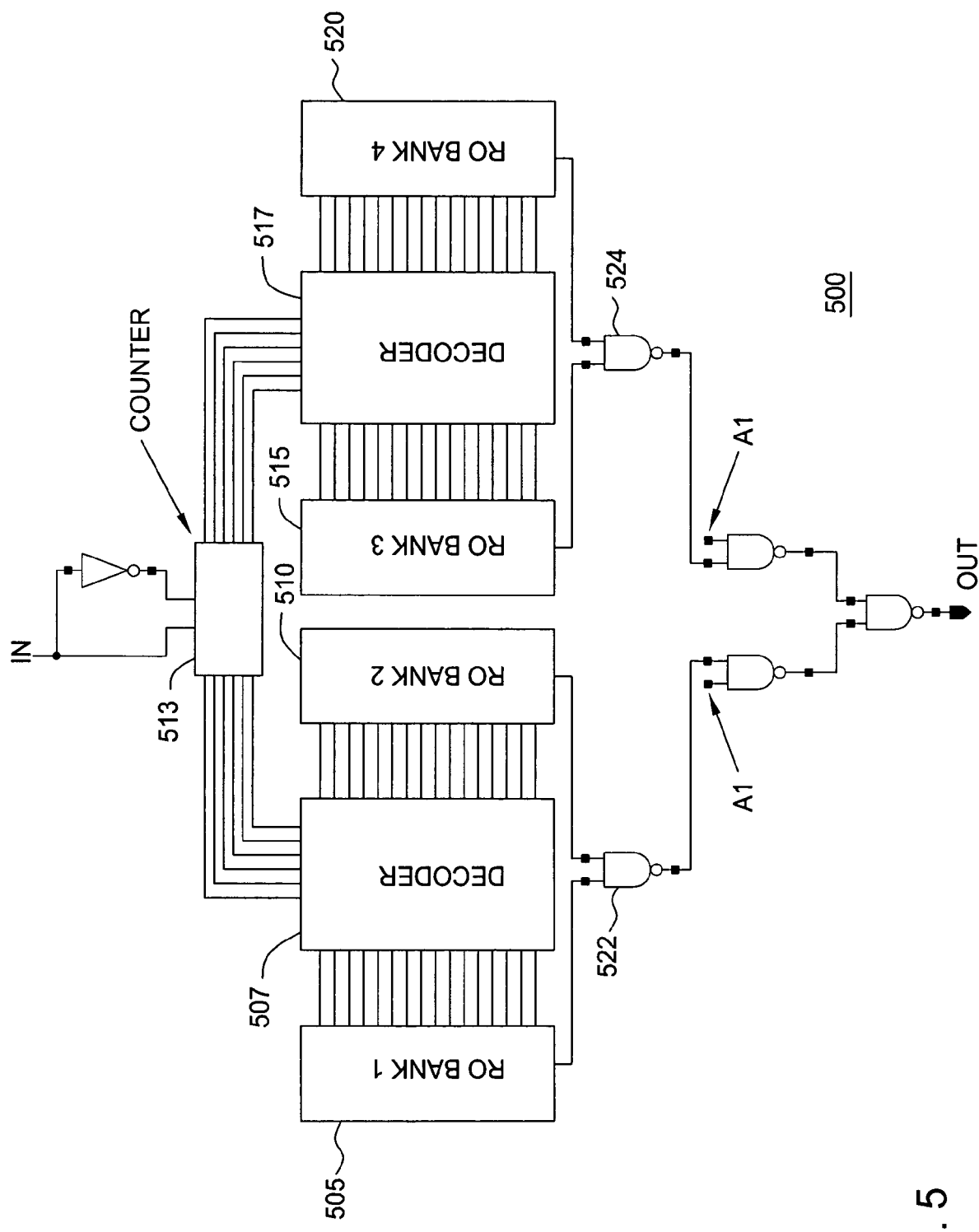
FIG. 5 illustrates a top level ring oscillator schematic in accordance with one embodiment of the present invention.

An embodiment of a top level array is shown in FIG. 5. FIG. 5 corresponds to a scaled up version of FIG. 2. The arrays 500 are structured as four banks of 16 oscillators 505, 510, 515, 520, a six bit decoder configured in two sections 507, 517, a six stage counter 513, and an output ORing circuit (MUX) 522, 524 that transfers the output of the one (and only one) ring oscillator that is selected to the OUT terminal of the array 500. A square wave of frequency F is delivered to the IN terminal of the array 500 and two A1 inputs are used to select (deselect) the array output. In this embodiment, inputs A1 are tied to the power supply of the corresponding clock circuit (not shown). Outputs of counter 513 and decoder 507, 517 are configured such that the array ring oscillators 505, 510, 515, 520 are sequentially selected at the rate of the input frequency, F. If F=40 Hz and the frequency of each array ring oscillator is about one Ghz, the output from the array is then a frequency modulated signal, changing in frequency about every 25 msec after about $2.5\times10^{*}7$ cycles of oscillation of the selected ring oscillator, analogous to the simplified case shown in FIG. 3. After 64 such time increments (about 2 sec in this case), the pattern at OUT repeats and continues to do so until the array is deselected.

It is possible to operate all of the arrays driven by a single clock circuit automatically in a sequential fashion. This can be accomplished by adding to the clock frequency divider a counter identical to those in the array, and then following this with two more counter stages (for the case of 4 arrays). The last two bits then drive a two bit decoder, which via array inputs A1 select one of the four arrays. In this mode all four arrays are powered up, but only the selected array has an active output, the other three being held at 0.

Figure 6:
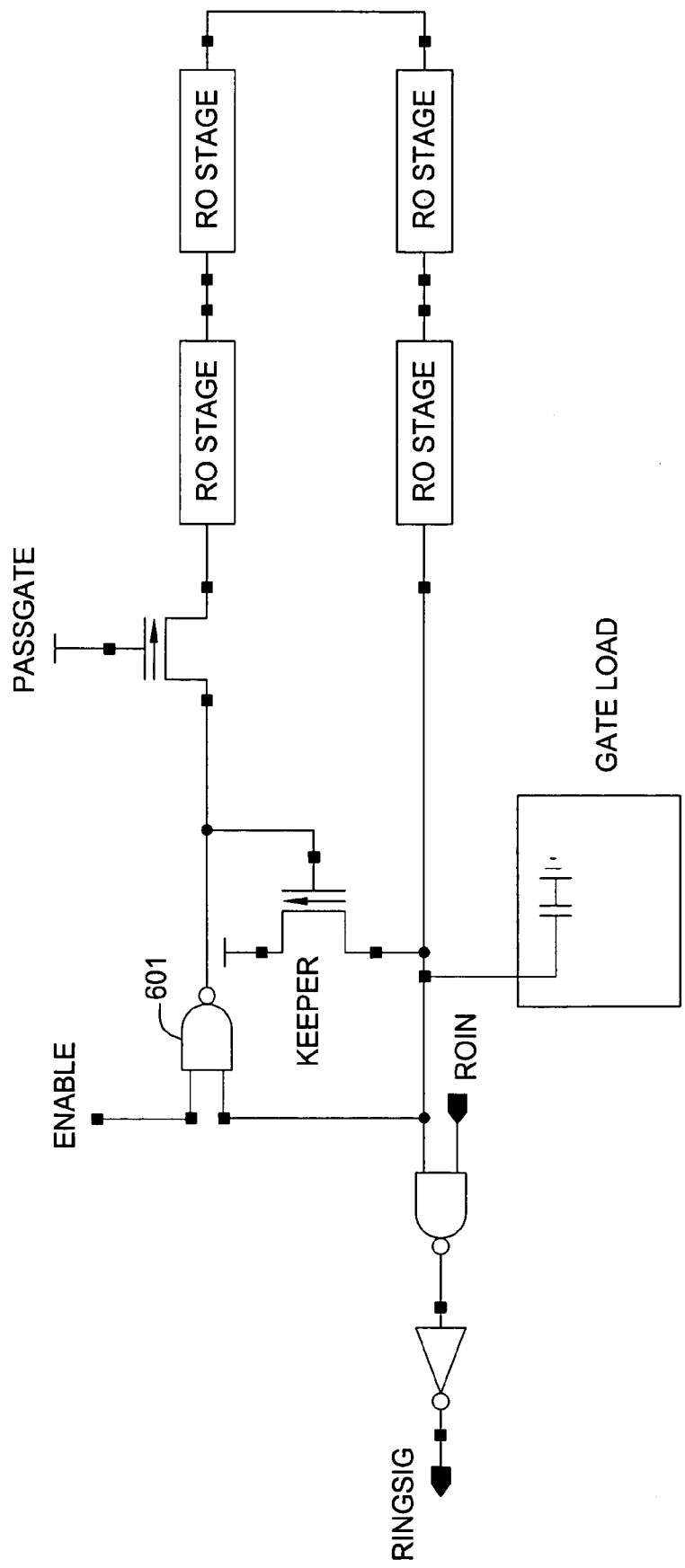
FIG. 6 illustrates an array ring oscillator in accordance with one embodiment of the present invention.

FIG. 6 illustrates an array ring oscillator in accordance with one embodiment of the present invention. In one embodiment each of the array ring oscillators has five stages comprising a NAND2 gate 601 followed by a small passgate and then a keeper across the following inverter. The delay of this circuit is very sensitive to the value of the threshold voltage Vt of the passgate. The variation in the delay of such a ring is dominated by the variation of the passgate Vt. The frequency modulation of the array output frequency is thus a direct measure of the distribution of the passgate Vt. Since there are five passgates in the ring, the ring frequency variation for a randomly distributed Vt will be $5^{1/2}$ of that associated with a single stage of the ring. By observing the output frequency spectrum as a function of the array power supply voltage and comparing with a standard simple inverter ring frequency (i.e. that of the clock which will be discussed below) one can obtain both the absolute value of Vt and its distribution across an array of 64 ring oscillators. Furthermore the frequency components follow the order in which the rings are enabled, so if one knows the starting point, the physical location of each of the 64 different Vt values can be obtained as well. In this implementation each of the eight arrays has a different passgate design, Positive-Channel Field Effect Transistors (PFETs) or Negative-Channel Field Effect Transistors (NFETs) of various dimensions.

The ORing function within a RO bank is implemented by feeding a signal from each ring through a NAND2 501. Terminal ROIN is driven by RINGSIG from the previous ring (or a "1" in the case of the top ring of a bank). If the ring is selected, then its oscillating output is fed out of terminal RINGSIG. If it is not selected then RINGSIG replicates whatever is fed into ROIN.

Figure 7:
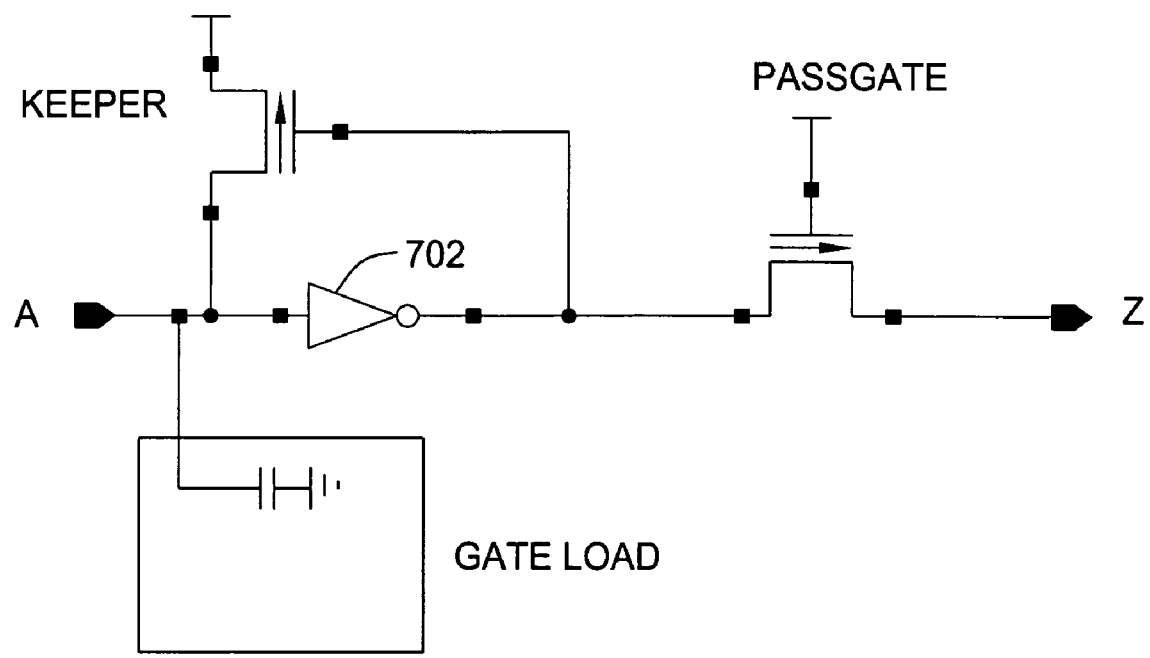
FIG. 7 illustrates an array ring oscillator stage in accordance with one embodiment of the present invention.

FIG. 7 illustrates an array ring oscillator stage in accordance with one embodiment of the present invention. In this embodiment, similar to FIG. 6, each of the array ring oscillators has five stages (not shown) comprising an inverter 702 followed by a small passgate and then a keeper across the following inverter. The delay of this circuit is very sensitive to the value of the threshold voltage Vt of the passgate. The variation in the delay of such a ring is dominated by the variation of the passgate Vt. The frequency modulation of the array output frequency is thus a direct measure of the distribution of the passgate Vt. Since there are five passgates (only inverter 702 is shown) in the ring, the ring frequency variation for a randomly distributed Vt will be $5^{1/2}$ of that associated with a single stage of the ring. By observing the output frequency spectrum as a function of the array power supply voltage and comparing with a standard simple inverter ring frequency (i.e. that of the clock which will be discussed below) one can obtain both the absolute value of Vt and its distribution across the array of 64 ring oscillators. Furthermore the frequency components follow the order in which the rings are enabled, so if one knows the starting point, the physical location of each of the 64 different Vt values can be obtained as well. In this implementation each of the eight arrays has a different passgate design, Positive-Channel Field Effect Transistors (PFETs) or Negative-Channel Field Effect Transistors (NFETs) of various dimensions. Similar to FIG. 6, the ORing function within a RO bank is implemented by feeding a signal from each ring through an inverter combination 702.

With respect to FIGS. 6 and 7, the ring oscillator frequencies can be lowered and the variation in ring oscillator frequency will increase rapidly as the array power supply voltage is reduced. This provides a basis for obtaining an absolute calibration on Vt and its spread, as well as improving the "signal-to-noise ratio" in cases of low Vt variation. The operation of the VDD-powered readout circuitry remains unaffected as the array power supply is lowered.

Figure 8:
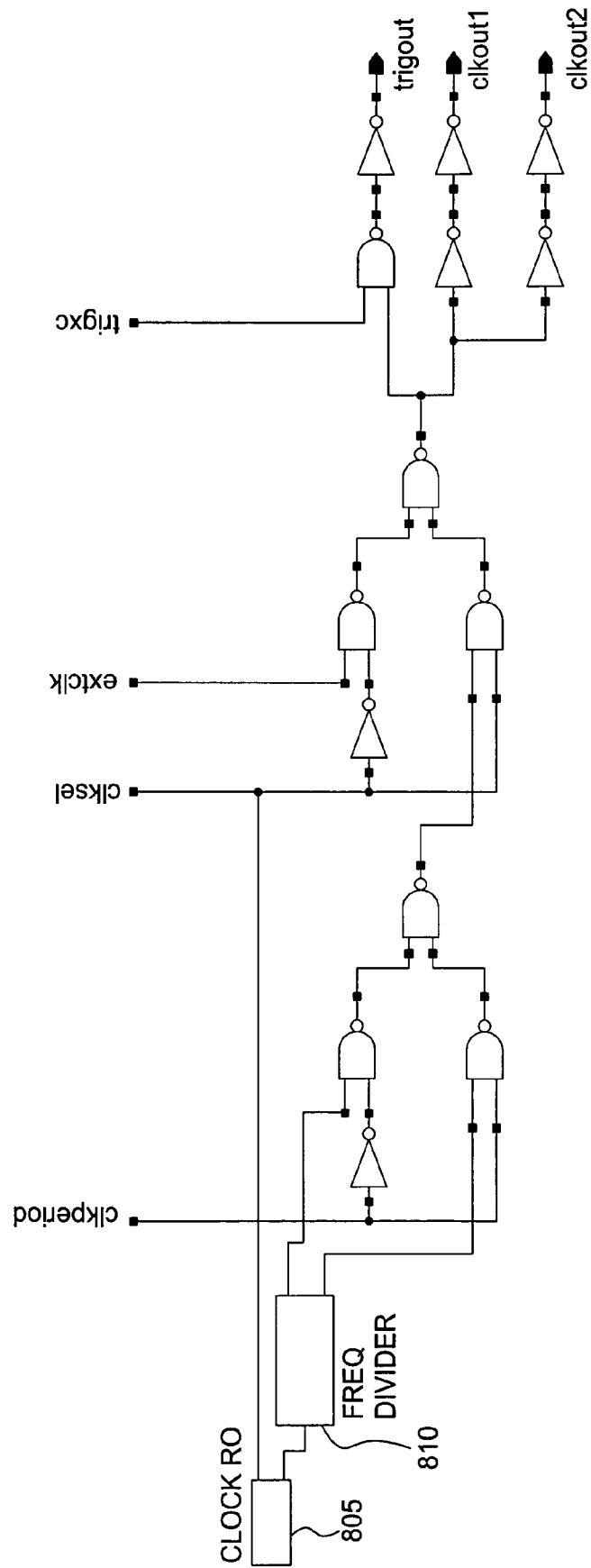
FIG. 8 illustrates a top level schematic of a clock circuit in accordance with one embodiment of the present invention.

FIG. 8 illustrates a top level schematic of a clock circuit 800 in accordance with one embodiment of the present invention. As shown in FIG. 3 each ring oscillator array is controlled by a clock circuit 310, 315, the top level circuit diagram of which is shown in FIG. 8. The clock circuit comprises a 300 stage reference ring oscillator 805, a 24 stage frequency divider 810 and various control and output circuits. There are four external inputs (clkperiod, clksel, extclk, and trigxc), and three identical outputs (one for the two arrays on the left of the clock circuit, one for the two arrays on the right of the clock circuit, and the third (trigout), which can be turned on and off with input trigxc. The ring oscillator stage comprises a standard gate-loaded inverter with a total load equivalent to a fanout of 3. The 300 stage oscillator 605 has a target frequency of about 170 MHz. Clkperiod is used to select at which point along the frequency divider the frequency F is obtained. This can be either after the 22 stages, giving F=40 Hz or after the full 24 stages giving an F of about 10 Hz. One also has the option of using an external (terminal extclk) rather than the internal clock, which may be desirable under certain situations. When clksel=1, the internal clock ring is on and driving the circuit. When clksel=0, the outputs of the clock circuit follow extclk which will have a frequency F typically in the range of a few Hz to a few kHz.

By having resetable frequency dividers/counters and by starting the readout process immediately following a reset it is possible to unambiguously correlate each frequency with a particular physical location. In particular this applies for a configuration that operates all of the arrays driven by a single clock circuit automatically in a sequential fashion.

By disabling one of the ring oscillators such that it does not oscillate when addressed, a 0-frequency marker will be present in the output waveform. This would allow one to unambiguously correlate each frequency with a particular physical location. Namely, the output signal from each of the semiconductor circuits can be multiplexed together to form a continuous output signal with successive increments in time corresponding to successively addressed semiconductor circuits. Thus, in one embodiment, an output signal from each semiconductor circuit is measured and read out over a common bus, where a distribution of the output signals is a measure of a distribution of a parameter of interest. The marker being incorporated in the continuous output signal can be used to identify a particular time increment with a particular physical location in the array of semiconductor circuits.

For larger arrays which may be square or rectangular, row and column (X and Y) decoders (e.g., a two dimensional decoder) can be used. The NAND2 in the ring would be replaced with a NAND3, with two SEL lines (e.g., A1 of FIG. 5) driven by the X and Y decoders. Such large arrays can be spread across the chip to study across chip variations as well as across wafer variations in a straightforward manner such that areas of several $mm^2$ or more can be implemented and this technique used to study spatial as well as statistical fluctuations over a large area.

The frequency modulation in the design described above occurs at a relatively slow rate (10–40 Hz) to be compatible with existing in-line measurement equipment. With more sophisticated commercially available instrumentation this rate can be increased dramatically (1 to 10's of kHz) without loss of accuracy.

In the particular embodiments described above, the ring oscillator stage has been designed so that variations in passgate Vt dominate changes in the stage delay and thus changes in the ring oscillator frequency. Other designs that emphasize other device and circuit parameter variations are also possible. For variations in via resistances, the gates in the array may be connected by metal lines with vias such that the via resistance dominates the ring delay. For variations in metal resistance and capacitances (Rw and Cw), the gates in the array may be loaded with metal wires such that the ring delay is either dominated by wire capacitance (metal comb structure) or by wire RwCw (e.g., wire resistance).

The present invention can be used as an in-line testable yield monitor to detect electrical opens in vias by connecting one metal layer to another metal layer above or below. The array ring in this case would comprise four inverters and a NAND gate with the output of one of the inverters connected to the gate of the following inverter by metal lines on two layers and a large number of vias in series. An open via will prevent the ring from oscillating. The output from a RO array is again a frequency modulated signal where 0-frequency output corresponds to an open, which can be localized for failure analysis from its known decoder address.

A variant of the arrangement to detect electrical opens as described above can be used to detect electrical shorts between metal lines. A metal comb is inserted between the output of one inverter and the gate of the following inverter. A short between the metal lines in the comb will allow the ring to oscillate. In this case the RO array output is primarily a long succession of 0-frequency output periods, with an occasional ringing period corresponding to a short. As with the open case, the short can be localized for failure analysis from its known decoder address.

The present invention could also be used to determine burn-in characteristics of a chip. In one embodiment about 1000 rings will be distributed across the surface of the chip whose area is primarily occupied by, for example, a complete microprocessor design. The rings are on an independent power supply and driven at a high voltage with the chip at an elevated temperature for some period of time T. Frequency measurements for the rings are made under nominal operating conditions before and after the burnin period and the changes in frequency are measured and used to predict future aging behavior of the chip.

Figure 9:
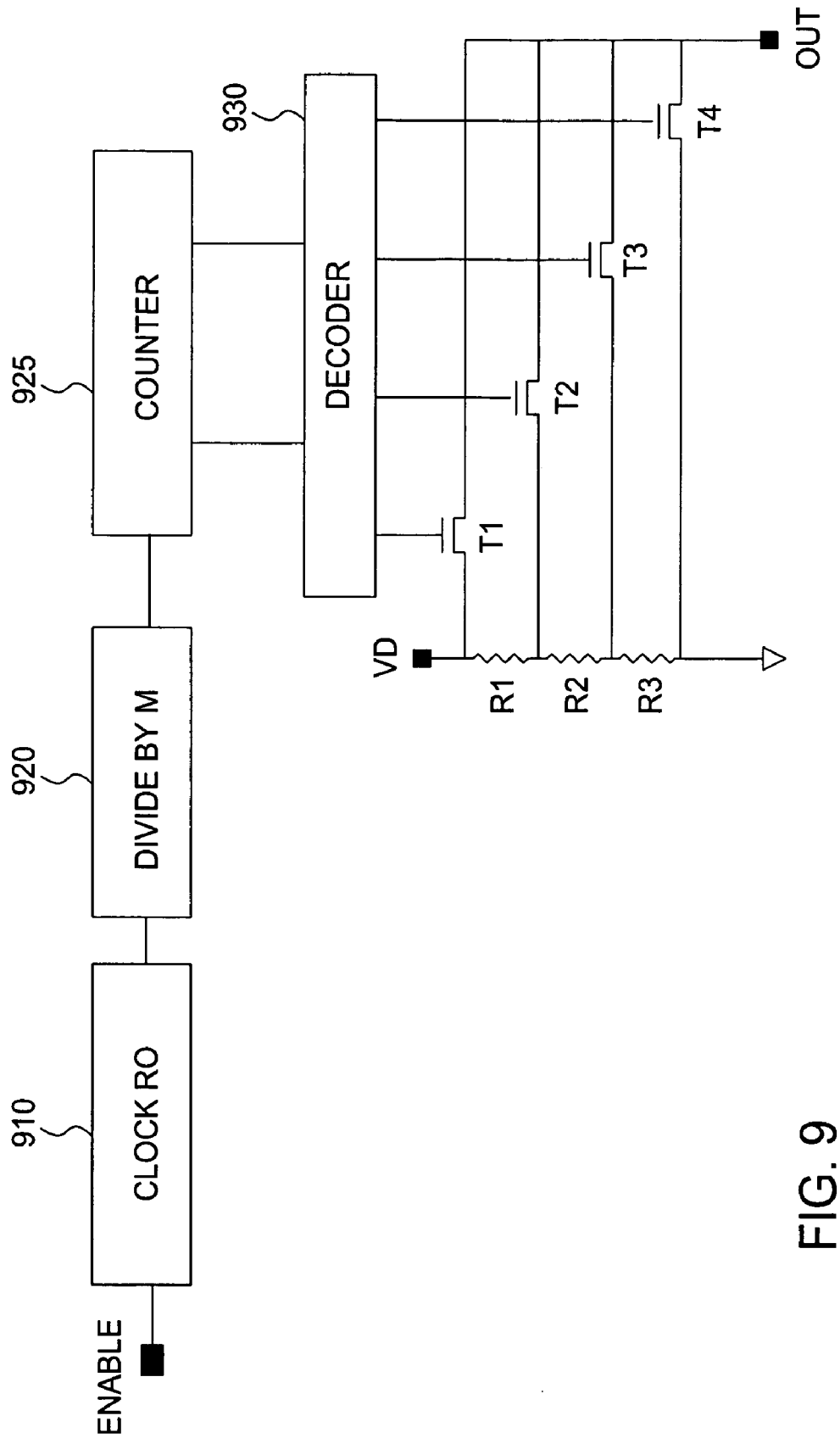
FIG. 9 illustrates a circuit for sequentially addressing and reading out the voltages at points within a linear array of resistors in accordance with one embodiment of the present invention.

FIG. 9 illustrates a circuit for sequentially addressing and reading out the voltages at points within a linear array of resistors in accordance with one embodiment of the present invention. This is a special case of the more general circuit shown in FIG. 2 in which the decoder now drives the gates of NFETs T1, T2, T3, and T4. Clock RO 910 generates a clock of period t that is slowed down by a factor M by a divider 920 and drives a counter 925 followed by a decoder 930. Decoder 930 enables each NFET T1, T2, T3, T4 sequentially for a fixed time interval T, where T=Mt. The voltage at the selected point in the resistor ladder appears at the OUT terminal, much as a ring oscillator signal did in the previous embodiments discussed. The elements R1, R2, and R3 are nominally identical resistive elements such as metal contacts, vias, segments of minimum width wire, segments of polysilicon, or segments of diffusion. A practical circuit could have 63–1027 or more resistive elements and an implementation with control circuitry much as described for the ring oscillator case, the primary difference being that the output is now a DC voltage as opposed to an oscillation at some frequency. This output voltage can be directly analyzed with a commercially available voltmeter to give the min, max, mean, and standard deviation of the resistance of the elements in the array. The transition back to the top of the staircase provides a built in marker for identifying which step corresponds to which resistor.

Figure 10:
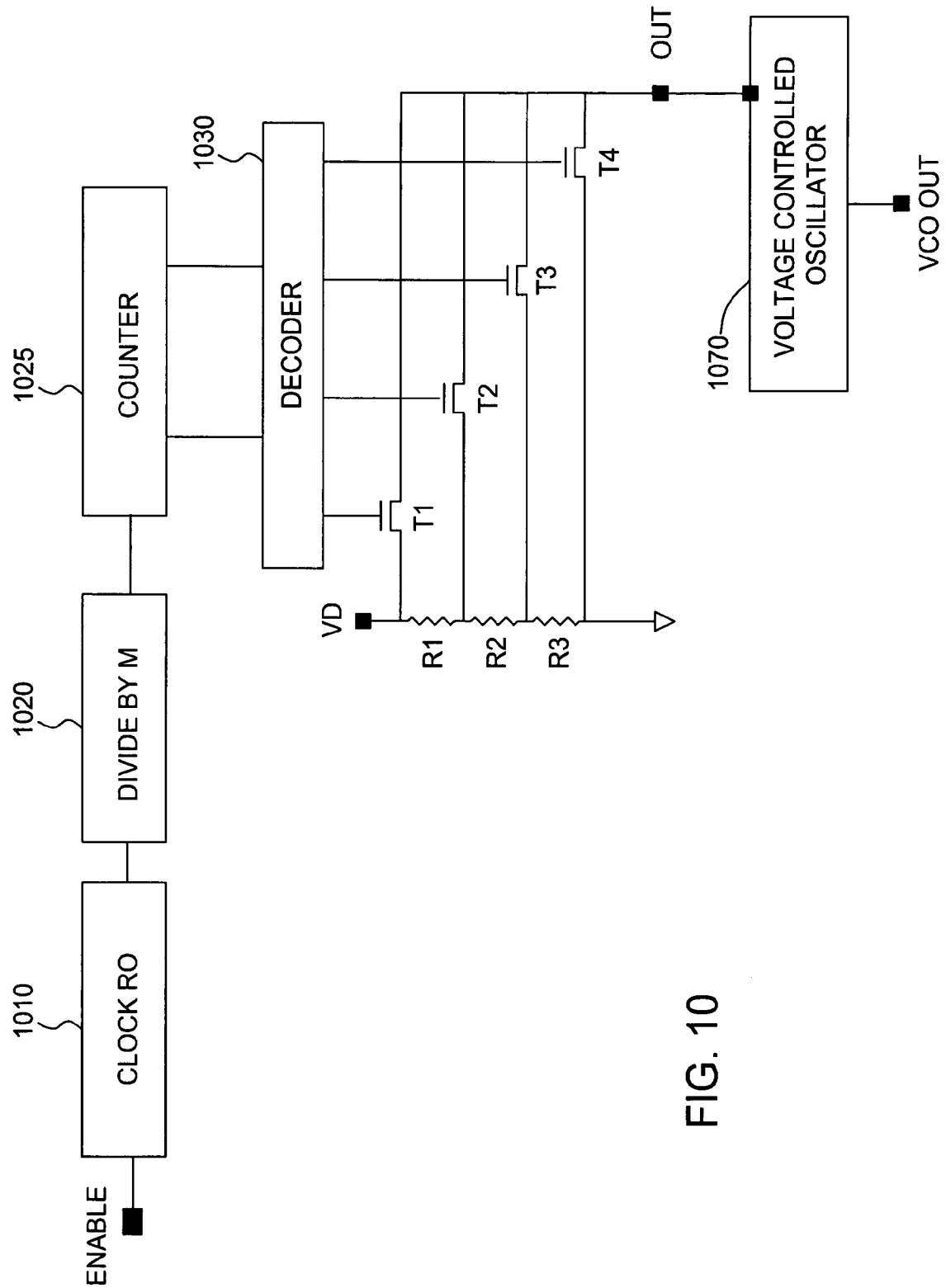
FIG. 10 illustrates a circuit for sequentially addressing and reading out the voltages at points within a linear array of resistors in accordance with one embodiment of the present invention.

FIG. 10 illustrates a circuit for sequentially addressing and reading out the voltages at points within a linear array of resistors in accordance with one embodiment of the present invention. Clock RO 1010 generates a clock of period t that is slowed down by a factor M by a divider 1020 and drives a counter 1025 followed by a decoder 1030. Decoder 1030 enables each NFET T1, T2, T3, T4 sequentially for a fixed time interval T, where T=Mt. The voltage at the selected point in the resistor ladder appears at the OUT terminal, much as a ring oscillator signal did in the previous embodiments discussed. The elements R1, R2, and R3 are nominally identical resistive elements such as metal contacts, segments of minimum width wire, or segments of polysilicon. A practical circuit could have 63–1027 or more resistive elements and an implementation with control circuitry much as described for the ring oscillator case, the primary difference being that the output is now a DC voltage as opposed to an oscillation at some frequency. In this embodiment, the output voltage becomes the input of a voltage controlled oscillator (VCO) 1070. The advantage of adding VCO is that the amplitude of the output signal is the full power supply voltage with the information encoded as a frequency. This is less susceptible to certain kinds of noise than the direct voltage readout and can also be run faster (shorter T) than the direct voltage readout, since a large offchip driver can be placed immediately after the VCO which is more difficult with the analog direct voltage readout scheme.

Figure 11:
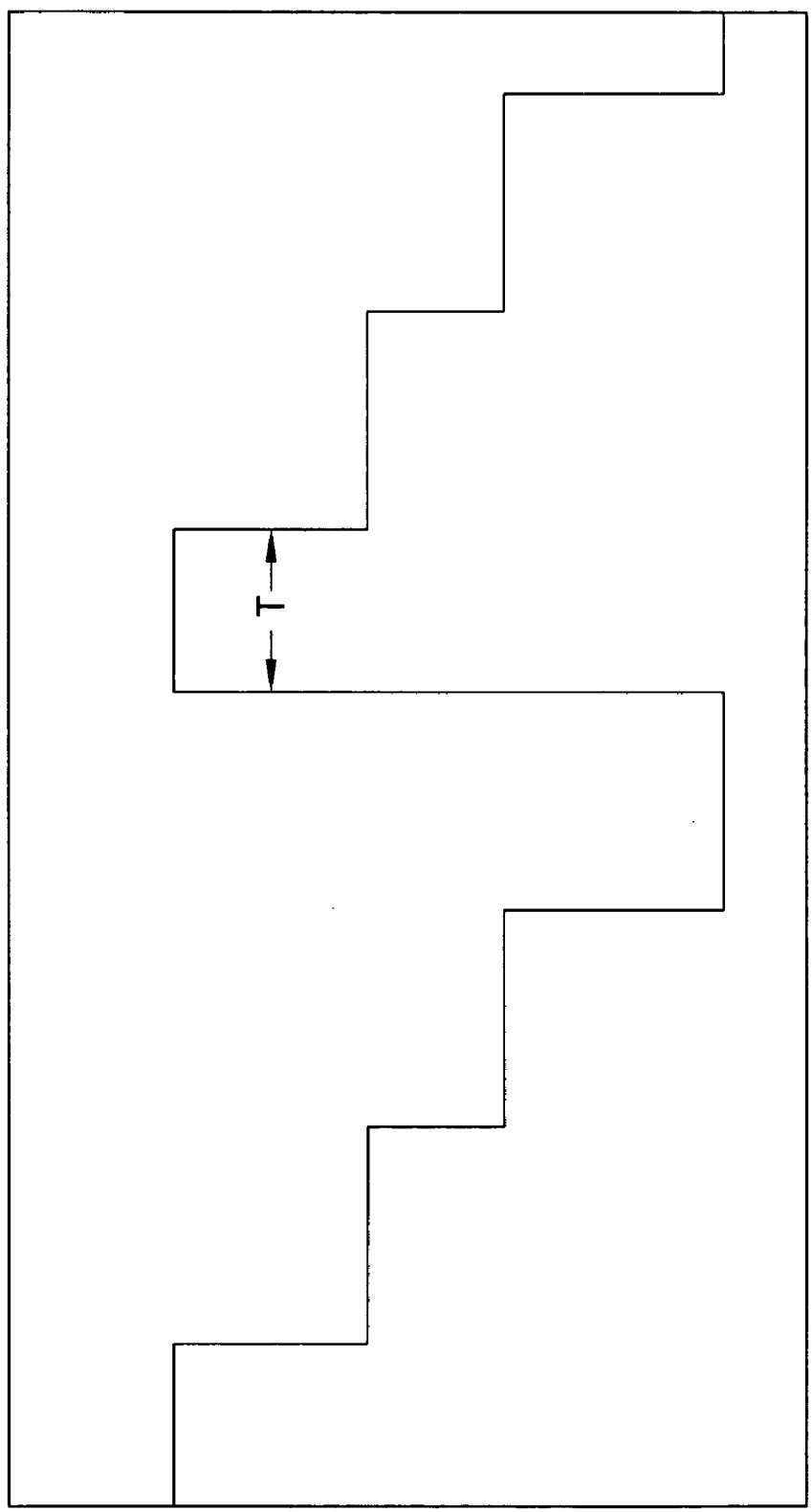
FIG. 11 illustrates an output voltage or frequency of a circuit in accordance with the embodiments of the present invention shown in FIG. 9 and FIG. 10.

FIG. 11 illustrates an output voltage or frequency of a circuit in accordance with the embodiments of the present invention shown in FIG. 9 and FIG. 10. From FIG. 9, the output will be a repetitive descending staircase with the decoder 930 configured to sequentially select points in the resistive ladder from top to bottom. From FIG. 10, the output frequency of VCO 1070 will be a repetitive descending staircase, where the variation in step height corresponds to the variation in resistance.

Figure 12:
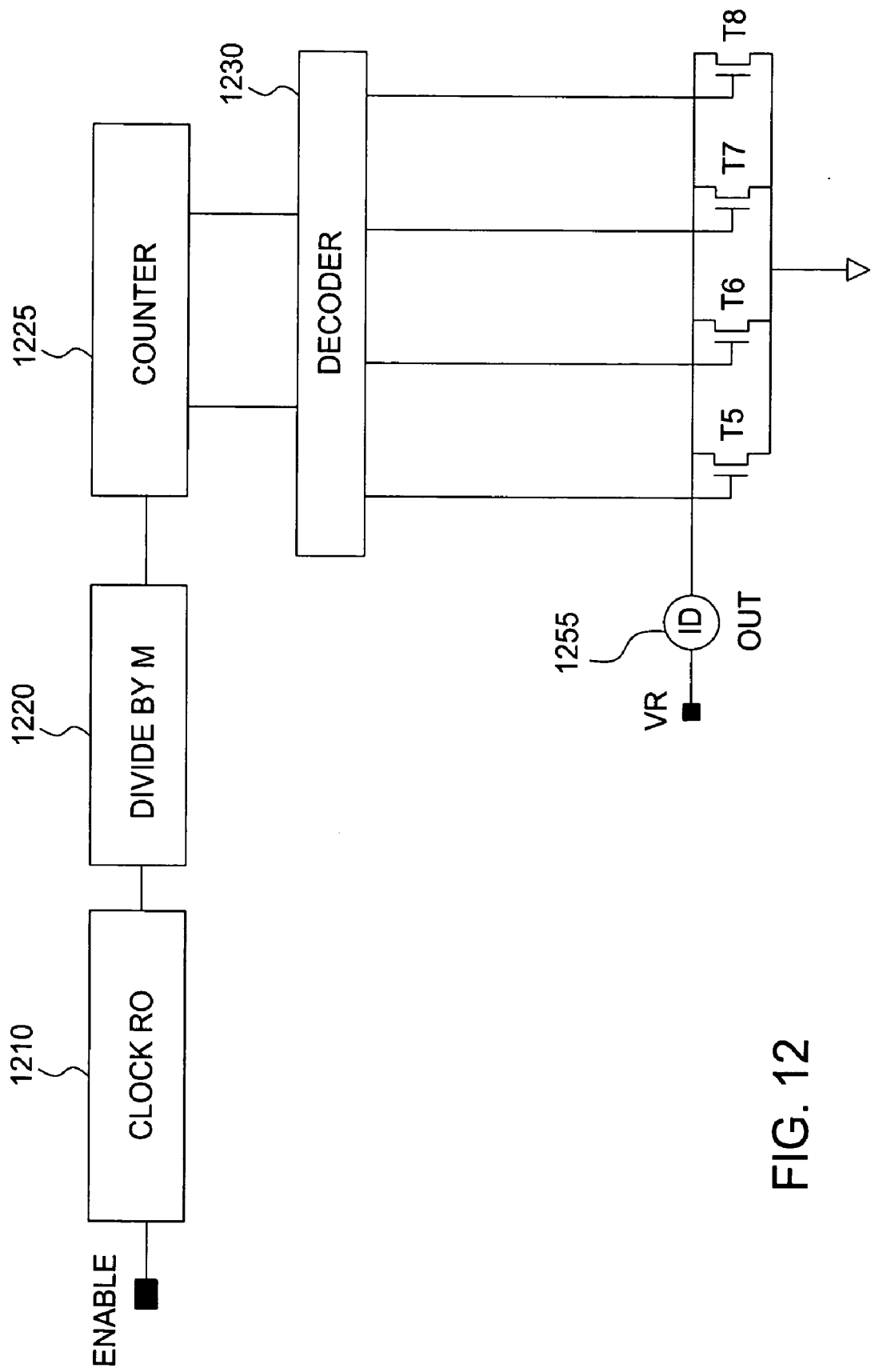
FIG. 12 illustrates a circuit for sequentially addressing and reading out the drain currents of transistors in an array in accordance with one embodiment of the present invention.

FIG. 12 illustrates a circuit for sequentially addressing and reading out the drain currents (e.g., constant currents) of transistors in an array in accordance with one embodiment of the present invention. This is a special case of the more general circuit shown in FIG. 2 in which the decoder now drives the gates of nominally identical NFETs T5, T6, T7, and T8. Clock RO 1210 generates a clock of period that is slowed down by a factor M by a divider 1220 and drives a counter 1225 followed by a decoder 1230. Decoder 1230 enables each NFET T1, T2, T3, T4 sequentially for a fixed time interval T, where T=Mt. Transistors T5, T6, T7, T8 are powered in parallel with a dedicated voltage source VR and share a common ground which may also be the ground of the decoder. The output is now the drain current ID of the selected NFET and is measured as the current drawn from the dedicated voltage source VR. With the decoder configured to sequentially select the NFETs in the array, the output will appear as that shown in FIG. 2, where the variation in amplitude now corresponds to the variation in drain current. A practical circuit could have 64–1024 or more nominally identical NFETs and an implementation with control circuitry much as described for the ring oscillator case, the primary difference being that the output is now a DC current as opposed to an oscillation at some frequency. The current ID flowing with no NFET selected would be measured and subtracted from each of the other ID readings to correct for the array off current. The output ID values can be directly analyzed with a commercially available current meter to give the min, max, mean, and standard deviation of the drain currents of the NFETs in the array.

Additionally, the present monitoring methods and/or data structures can be represented by one or more software applications (or even a combination of software and hardware, e.g., using application specific integrated circuits (ASIC)), where the software is loaded from a storage medium, (e.g., a ROM, a magnetic or optical drive or diskette) into a memory and operated by the CPU (e.g., a processor). As such, the present monitoring methods and/or data structures of the present invention can be stored on a computer readable medium, e.g., RAM memory, ROM, magnetic or optical drive or diskette and the like.

While foregoing is directed to the preferred embodiment of the present invention, other and further embodiments of the invention may be devised without departing from the basic scope thereof.

The invention claimed is:

1. A method for analyzing a plurality of semiconductor circuits, comprising:
    providing at least one array of semiconductor circuits;
    sequentially addressing each semiconductor circuit; and
    sequentially combining respective output signals from said semiconductor circuits into a single modulated signal, a degree of modulation of the single modulated signal being dependent on a variability in a physical parameter of interest of the semiconductor circuits.

2. The method of claim 1, wherein the output signal from each of said semiconductor circuits comprises a voltage.

3. The method of claim 1, wherein the output signal from each of said semiconductor circuits comprises a current.

4. The method of claim 1, wherein the output signal from each of said semiconductor circuits comprises a frequency.

5. The method of claim 1, wherein the parameter of interest comprises a threshold voltage of said semiconductor circuit.

6. The method of claim 1, wherein the parameter of interest comprises a drain current of said semiconductor circuit.

7. The method of claim 1, wherein the parameter of interest comprises a current in a linear region of said semiconductor circuit, where said semiconductor circuit is a transistor.

8. The method of claim 1, wherein the parameter of interest comprises a resistance of said semiconductor circuit.

9. The method of claim 1, wherein said array of semiconductor circuits are sequentially addressed by a decoder.

10. The method of claim 9, wherein said decoder is a one dimensional decoder with one selecting output or a two dimensional decoder with a first selecting output and a second selecting output.

11. The method of claim 9, further comprising:
providing a plurality of clocked input signals to the decoder that are generated by a counter driven by an oscillator circuit.

12. The method of claim 11, wherein the oscillator circuit comprises a ring oscillator and a frequency divider.

13. The method of claim 1, wherein the output signal from each of said semiconductor circuits is multiplexed together to form a continuous output signal with successive increments in time corresponding to successively addressed semiconductor circuits.

14. The method of claim 13, wherein a marker is incorporated in the continuous output signal for identifying a particular time increment with a particular physical location in said at least one array of semiconductor circuits.

15. The method of claim 14, wherein the marker allows identification of each time increment in the output signal with a particular semiconductor circuit.

16. The method of claim 14, wherein said marker is created by omitting one of the said semiconductor circuits such that its output signal is at a zero level.

17. The method of claim 1, wherein said at least one array of semiconductor circuits comprises a plurality of individually addressable semiconductor circuits powered in parallel or in series.

18. The method of claim 17, wherein the semiconductor circuits comprise ring oscillators and the output signal from a selected semiconductor circuit comprises a constant frequency oscillation or a constant current.

19. The method of claim 18, wherein the output of each ring oscillator is used to detect an open or a short.

20. The method of claim 17, wherein the parameter of interest comprises at least one of a threshold voltage, a via resistance, a wire capacitance and a wire resistance.

21. The method of claim 1, wherein the semiconductor circuits comprise n-channel field effect transistors or p-channel field effect transistors and the output signal comprises a current.

22. The method of claim 21, wherein the parameter of interest comprises a drain to source current of the addressed field effect transistor.

23. The method of claim 1, wherein the plurality of semiconductor circuits comprise resistive elements.

24. The method of claim 23, wherein the parameter of interest comprises a resistance of the resistive elements.

25. The method of claim 24, wherein the resistive elements comprise vias, segments of wire, segments of polysilicon or segments of diffusion.

26. An apparatus for analyzing a plurality of semiconductor circuits, comprising:
at least one array of $2^n$ semiconductor circuits;
a clock ring oscillator having a predefined period for providing a clock signal;
a frequency divider for dividing said clock;
an n-stage binary counter for generating n decoder inputs from said divided clock signal;
a decoder for sequentially addressing each semiconductor circuit using said n decoder inputs; and
a common output bus where output signals from said semiconductor circuits are sequentially combined into a single modulated signal, a degree of modulation of the single modulated signal being dependent on a variability in a physical parameter of interest of the semiconductor circuits.

27. The apparatus of claim 26, wherein each semiconductor circuit of said at least one array outputs a voltage.

28. The apparatus of claim 26, wherein each semiconductor circuit of said at least one array outputs a current.

29. The apparatus of claim 26, wherein each semiconductor circuit of said at least one array outputs a frequency.

30. The apparatus of claim 26, wherein the parameter of interest comprises a threshold voltage of said semiconductor circuit.

31. The apparatus of claim 26, wherein the parameter of interest comprises a drain current of said semiconductor circuit.

32. The apparatus of claim 26, wherein the parameter of interest comprises a current in a linear region of said semiconductor circuit, where said semiconductor circuit is a transistor.

33. The apparatus of claim 26, wherein the parameter of interest comprises a resistance of said semiconductor circuit.

34. The apparatus of claim 26, wherein the semiconductor circuits comprise ring oscillators.

35. The apparatus of claim 26, wherein the semiconductor circuits comprise n-channel or p-channel field effect transistors.

36. The apparatus of claim 26, wherein said decoder is a one dimensional decoder with one selecting output or a two dimensional decoder with a first selecting output and a second selecting output.

37. The apparatus of claim 26, wherein the output signal from each of said semiconductor circuits is multiplexed together to form a continuous output signal with successive increments in time corresponding to successively addressed semiconductor circuits.

38. The apparatus of claim 37, wherein a marker is incorporated in the continuous output signal for identifying a particular time increment with a particular physical location in said at least one array of semiconductor circuits.

39. The apparatus of claim 38, wherein the marker allows identification of each time increment in the output signal with a particular semiconductor circuit.

40. The apparatus of claim 38, wherein said marker is created by omitting one of the said semiconductor circuits such that its output signal is at a zero level.

41. The apparatus of claim 26, wherein said at least one array of semiconductor circuits comprises a plurality of individually addressable semiconductor circuits powered in parallel or in series.

42. The apparatus of claim 41, wherein the semiconductor circuits comprise ring oscillators and the output signal from a selected semiconductor circuit comprises a constant frequency oscillation or a constant current.

43. The apparatus of claim 42, wherein the output of each ring oscillator is used to detect an open or a short.

44. The apparatus of claim 41, wherein the parameter of interest comprises at least one of a threshold voltage, a via resistance, a wire capacitance and a wire resistance.

45. The apparatus of claim 26, wherein the semiconductor circuits comprise n-channel field effect transistors or p-channel field effect transistors and the output signal comprises a current.

46. The apparatus of claim 45, wherein the parameter of interest comprises a drain to source current of the addressed field effect transistor.

47. The apparatus of claim 26, wherein the plurality of semiconductor circuits comprise resistive elements.

48. The apparatus of claim 47, wherein the parameter of interest comprises a resistance of the resistive elements.

49. The apparatus of claim 48, wherein the resistive elements comprise vias, segments of wire, segments of polysilicon or segments of diffusion.

50. A computer-readable medium having stored thereon a plurality of instructions, the plurality of instructions including instructions which, when executed by a processor, cause the processor to perform the steps of a method for analyzing at least one array of semiconductor circuits comprising:
sequentially addressing each semiconductor circuit; and
sequentially combining respective output signals from said semiconductor circuits into a single modulated signal, a degree of modulation of the single modulated signal being dependent on a variability in a physical parameter of interest of the semiconductor circuits.

51. The computer-readable medium of claim 50, wherein the output signal from each of said semiconductor circuits comprises a voltage.

52. The computer-readable medium of claim 50, wherein the output signal from each of said semiconductor circuits comprises a current.

53. The computer-readable medium of claim 50, wherein the output signal from each of said semiconductor circuits comprises a frequency.

54. The computer-readable medium of claim 50, wherein the parameter of interest comprises a threshold voltage of said semiconductor circuit.

55. The computer-readable medium of claim 50, wherein the parameter of interest comprises a drain current of said semiconductor circuit.

56. The computer-readable medium of claim 50, wherein the parameter of interest comprises a current in a linear region of said semiconductor circuit, where said semiconductor circuit is a transistor.

57. The computer-readable medium of claim 50, wherein the parameter of interest comprises a resistance of said semiconductor circuit.

58. The computer-readable medium of claim 50, wherein said array of semiconductor circuits are sequentially addressed by a decoder.

59. The computer-readable medium of claim 58, wherein said decoder is a one dimensional decoder with one selecting output or a two dimensional decoder with a first selecting output and a second selecting output.

60. The computer-readable medium of claim 58, further comprising:
providing a plurality of clocked input signals to the decoder that are generated by a counter driven by an oscillator circuit.

61. The computer-readable medium of claim 60, wherein the oscillator circuit comprises a ring oscillator and a frequency divider.

62. The computer-readable medium of claim 50, wherein the output signal from each of said semiconductor circuits is multiplexed together to form a continuous output signal with successive increments in time corresponding to successively addressed semiconductor circuits.

63. The computer-readable medium of claim 62, wherein a marker is incorporated in the continuous output signal for identifying a particular time increment with a particular physical location in said at least one array of semiconductor circuits.

64. The computer-readable medium of claim 63, wherein the marker allows identification of each time increment in the output signal with a particular semiconductor circuit.

65. The computer-readable medium of claim 63, wherein said marker is created by omitting one of the said semiconductor circuits such that its output signal is at a zero level.

66. The computer-readable medium of claim 50, wherein said at least one array of semiconductor circuits comprises a plurality of individually addressable semiconductor circuits powered in parallel or in series.

67. The computer-readable medium of claim 66, wherein the semiconductor circuits comprise ring oscillators and the output signal from a selected semiconductor circuit comprises a constant frequency oscillation or a constant current.

68. The computer-readable medium of claim 67, wherein the output of each ring oscillator is used to detect an open or a short.

69. The computer-readable medium of claim 66, wherein the parameter of interest comprises at least one of a threshold voltage, a via resistance, a wire capacitance and a wire resistance.

70. The computer-readable medium of claim 50, wherein the semiconductor circuits comprise n-channel field effect transistors or p-channel field effect transistors and the output signal comprises a current.

71. The computer-readable medium of claim 70, wherein the parameter of interest comprises a drain to source current of the addressed field effect transistor.

72. The computer-readable medium of claim 50, wherein the plurality of semiconductor circuits comprise resistive elements.

73. The computer-readable medium of claim 72, wherein the parameter of interest comprises a resistance of the resistive elements.

74. The computer-readable medium of claim 73, wherein the resistive elements comprise vias, segments of wire, segments of polysilicon or segments of diffusion.

* * * * *